US012677457B2

(12) United States Patent
Hsu et al.

(10) Patent No.: US 12,677,457 B2
(45) Date of Patent: Jul. 7, 2026

(54) SUPERLATTICE STRUCTURE WITH STRESS RELAXATION LAYERS THEREIN

(71) Applicant: UNITED MICROELECTRONICS CORP., Hsin-Chu City (TW)

(72) Inventors: Yu-Ming Hsu, Changhua County (TW); Chun-Liang Kuo, Kaohsiung City (TW); Yen-Hsing Chen, Taipei City (TW); Tsung-Mu Yang, Tainan City (TW); Yu-Ren Wang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 335 days.

(21) Appl. No.: 17/334,837

(22) Filed: May 31, 2021

(65) Prior Publication Data

US 2022/0344474 A1 Oct. 27, 2022

(30) Foreign Application Priority Data

Apr. 25, 2021 (CN) .......................... 202110447002.5

(51) Int. Cl.
| | |
|---|---|
| *H10D 62/815* | (2025.01) |
| *H10D 30/47* | (2025.01) |
| *H10D 62/824* | (2025.01) |
| *H10D 62/85* | (2025.01) |
| *H10W 42/00* | (2026.01) |

(52) U.S. Cl.
CPC ..... *H10D 62/8171* (2025.01); *H10D 30/4738* (2025.01); *H10D 62/824* (2025.01); *H10D 62/8503* (2025.01); *H10W 42/121* (2026.01)

(58) Field of Classification Search
CPC . H01L 29/157; H01L 23/562; H01L 29/2003; H01L 29/205; H01L 29/7785; H10D 62/8171; H10D 62/8503; H10D 62/824; H10D 30/4738; H10W 42/121
See application file for complete search history.

(56) References Cited

U.S. PATENT DOCUMENTS

| | | | | |
|---|---|---|---|---|
| 9,166,031 | B2 | 10/2015 | Kotani | |
| 9,196,685 | B2 | 11/2015 | Tomabechi | |
| 10,199,217 | B2 * | 2/2019 | Chu | ...................... H01L 29/861 |
| 2009/0205707 | A1 * | 8/2009 | Ikenoue | ................ H10F 77/244 |
| | | | | 257/E21.294 |
| 2013/0032781 | A1 | 2/2013 | Miyoshi | |

(Continued)

FOREIGN PATENT DOCUMENTS

| | | |
|---|---|---|
| CN | 111146282 | 5/2020 |
| TW | 202017187 | 5/2020 |

*Primary Examiner* — Norman D Richards
*Assistant Examiner* — Sean Ayers Winters
(74) *Attorney, Agent, or Firm* — Winston Hsu

(57) ABSTRACT

A superlattice structure includes a substrate. A first superlattice stack is disposed on the substrate. The first superlattice stack includes a first superlattice layer, a second superlattice layer and a third superlattice layer disposed from bottom to top. Three stress relaxation layers respectively disposed between the first superlattice layer and the second superlattice layer, the second superlattice layer and the third superlattice layer and on the third superlattice layer. Each of the stress relaxation layers includes a group III-V compound layer. The thickness of each of the stress relaxation layers should be greater than a relaxation critical thickness.

14 Claims, 7 Drawing Sheets

(56) References Cited

U.S. PATENT DOCUMENTS

| 2013/0087762 | A1 | | 4/2013 | Hung | |
|---|---|---|---|---|---|
| 2013/0328106 | A1 | * | 12/2013 | Kokawa | H01L 29/201 |
| | | | | | 257/190 |
| 2014/0091313 | A1 | * | 4/2014 | Kotani | H10D 62/60 |
| | | | | | 257/76 |
| 2015/0021616 | A1 | * | 1/2015 | Lee | H01L 29/7787 |
| | | | | | 257/76 |
| 2015/0115220 | A1 | * | 4/2015 | Iza | H10H 20/811 |
| | | | | | 438/47 |
| 2016/0149000 | A1 | * | 5/2016 | Sazawa | C23C 16/303 |
| | | | | | 257/18 |
| 2016/0211330 | A1 | * | 7/2016 | Li | H01L 29/7786 |
| 2016/0380090 | A1 | * | 12/2016 | Roberts | H10D 30/475 |
| | | | | | 257/76 |
| 2017/0125573 | A1 | * | 5/2017 | Lin | H01L 29/0619 |
| 2017/0278961 | A1 | * | 9/2017 | Hill | H01L 21/26546 |
| 2019/0115459 | A1 | * | 4/2019 | Kim | H01L 29/1004 |
| 2019/0157081 | A1 | * | 5/2019 | Zhao | H01L 21/02458 |
| 2019/0206994 | A1 | * | 7/2019 | Huang | H01L 29/6631 |
| 2019/0362967 | A1 | * | 11/2019 | Zhao | H01L 21/02381 |
| 2021/0057561 | A1 | * | 2/2021 | Hsieh | H01L 21/02458 |
| 2021/0057562 | A1 | * | 2/2021 | Hsieh | H01L 29/7786 |

* cited by examiner

SUPERLATTICE STRUCTURE WITH STRESS RELAXATION LAYERS THEREIN

BACKGROUND OF THE INVENTION

1. Field of the Invention

The present invention relates to a superlattice structure, and more particularity to a superlattice structure applied to a high electron mobility transistor (HEMT).

2. Description of the Prior Art

Due to their semiconductor characteristics, III-V semiconductor compounds may be applied in many kinds of integrated circuit devices, such as high power field effect transistors, high frequency transistors, or HEMTs. In the high electron mobility transistor, two semiconductor materials with different band-gaps are combined and a hetero-junction is formed at the junction between the semiconductor materials as a channel for carriers. In recent years, gallium nitride (GaN) based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

Because of lattice mismatch between a silicon substrate and a nucleation layer, dislocations occur in the epitaxial layer. These dislocations generate stress passing vertically toward the active area. The superlattice layer is used to block the vertically-passing stress. However, when the superlattice layer reaches a certain thickness, the ability to block vertically-passing stress is decreased.

SUMMARY OF THE INVENTION

In light of above, a new structure of a superlattice structure is provided to solve the above-mentioned problem.

According to a preferred embodiment of the present invention, a superlattice structure includes a substrate. A first superlattice stack is disposed on the substrate, The first superlattice stack includes a first superlattice layer, a second superlattice layer and a third superlattice layer disposed from bottom to top. The first superlattice stack includes A pair(s) of a first aluminum gallium nitride layer and a first III-V group material layer, the second superlattice stack includes B pair(s) of a second aluminum gallium nitride layer and a second III-V group material layer, the third superlattice stack includes C pair(s) of a third aluminum gallium nitride layer and a third III-V group material layer, and A, B, C are positive integers. Two stress relaxation layers are respectively disposed between the first superlattice layer and the second superlattice layer, and between the second superlattice layer and the third superlattice layer, wherein each of the two stress relaxation layers respectively includes a III-V group material layer. A second superlattice stack is disposed on the first superlattice stack. The second superlattice stack includes at least a pair of undoped gallium nitride layer and a carbon-doped gallium nitride layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 9 depicts a normally-off transistor on a superlattice structure of the present invention.

FIG. 10 depicts a normally-on transistor on a superlattice structure of the present invention.

DETAILED DESCRIPTION

Figure 1:
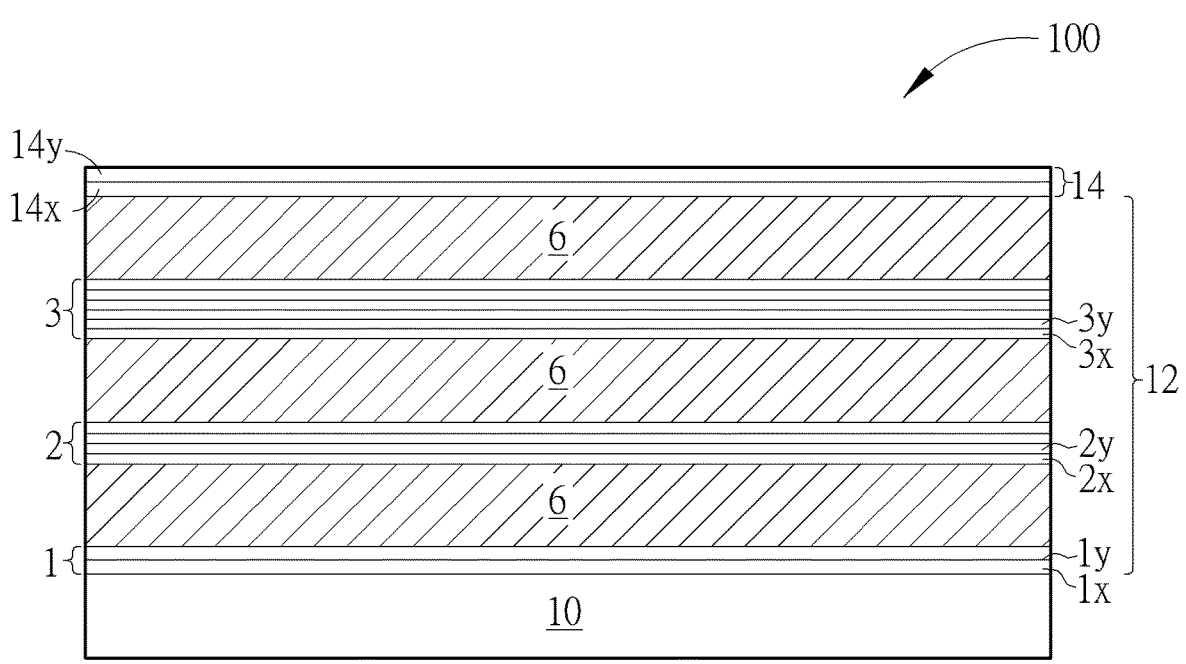
FIG. 1 depicts a superlattice structure according to a first preferred embodiment of the present invention.
Figure 2:
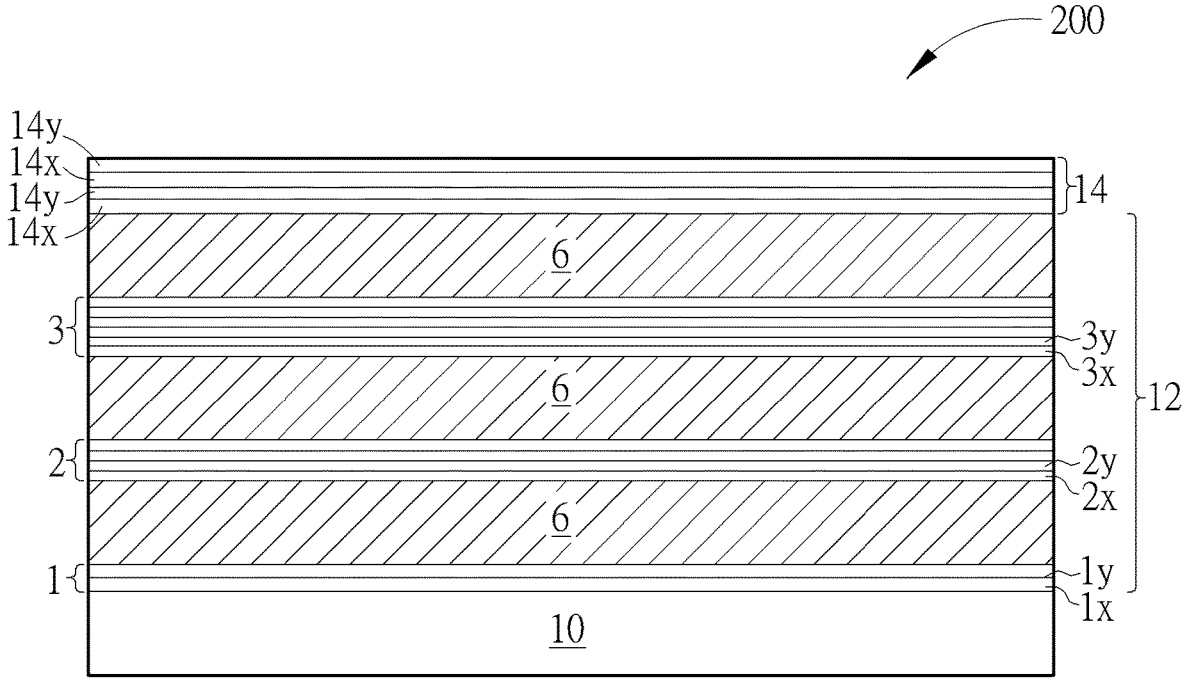
FIG. 2 depicts a varied type of a superlattice structure according to the first preferred embodiment.

FIG. 1 depicts a superlattice structure according to a first preferred embodiment of the present invention. FIG. 2 depicts a varied type of a superlattice structure according to the first preferred embodiment, wherein elements which are substantially the same as those in the first preferred embodiment are denoted by the same reference numerals; an accompanying explanation is therefore omitted.

As shown in FIG. 1, a superlattice structure 100 includes a substrate 10. A first superlattice stack 12 is disposed on the substrate 10. A second superlattice stack 14 is disposed on the first superlattice stack 12. The first superlattice stack 12 includes a first superlattice layer 1, a second superlattice layer 2 and a third superlattice layer 2 disposed from bottom to top. The first superlattice layer 1 includes A pair(s) of a first aluminum gallium nitride layer $1x$ and a first III-V group material layer $1y$. The second superlattice layer 2 includes B pair(s) of a second aluminum gallium nitride layer $2x$ and a second III-V group material layer $2y$. The third superlattice layer 3 includes C pair(s) of a third aluminum gallium nitride layer $3x$ and a third III-V group material layer $3y$. A, B, C are positive integers. More specifically speaking, the first superlattice layer 1 is formed by stacking the first aluminum gallium nitride layer $1x$ and the first III-V group material layer $1y$ alternately, and the positive integer "A" represents the number of times that this alternately stacking is performed. A layer of the first aluminum gallium nitride layer $1x$ and a layer of the first III-V group material layer $1y$ are defined as one pair, and the stacking sequence is not limited. For example, when A equals 1, the first superlattice layer 1 includes one pair of the first aluminum gallium nitride layer $1x$ and the first III-V group material layer $1y$. In other words, when A equals 1, the first superlattice layer 1 is formed by stacking a layer of the first aluminum gallium nitride layer $1x$ and a layer of the first III-V group material layer $1y$ alternately once. When A equals 2, the first superlattice layer 1 includes two pairs of the first aluminum gallium nitride layer $1x$ and the first III-V group material layer $1y$. In other words, when A equals 2, the first superlattice layer 1 is formed by stacking a layer of the first aluminum gallium nitride layer $1x$ and a layer of the first III-V group material layer $1y$ alternately twice. Similarly, the second superlattice layer 2 is formed by stacking a layer of the second aluminum gallium nitride layer 2x and a layer of the second III-V group material layer 2y alternately. A layer of the second aluminum gallium nitride layer 2x and a layer of the second III-V group material layer 2y are defined as one pair, and the stacking sequence is not limited. The third superlattice layer 3 is formed by stacking a layer of the third aluminum gallium nitride layer 3x and a layer of the third III-V group material layer 3y alternately. A layer of the third aluminum gallium nitride layer 3x and a layer of the third III-V group material layer 3y are defined as one pair, and the stacking sequence is not limited. Numbers of A, B and C are depended on pair numbers respectively in the first superlattice layer 1, and the second superlattice layer 2 and the third superlattice layer 3. According to a preferred embodiment of the present invention, C>B>A and A>5. That is, the superlattice layer farther from the substrate 10 has more pairs and the pair number formed by the first aluminum gallium nitride layer 1x and the first III-V group material layer 1y of the first superlattice layer 1 is greater than 5. However, in other cases, the pair numbers of A, B and C can be A=B=C or A<B, B=C. Alternatively, the pair numbers of A, B and C can be other combinations.

A thickness of the first aluminum gallium nitride layer 1x is between 20 nm and 30 nm, a thickness of the second aluminum gallium nitride layer 2x is between 20 nm and 30 nm, and a thickness of the third aluminum gallium nitride layer 3x is between 20 nm and 30 nm.

Moreover, the first III-V group material layer 1y is selected from one of aluminum nitride and gallium nitride. Advantageously, a thickness of the first III-V group material layer 1y is between 5 nm and 6 nm. The second III-V group material layer 2y is selected from one of aluminum nitride and gallium nitride. Advantageously, a thickness of the second III-V group material layer 2y is between 5 nm and 6 nm. The third III-V group material layer 3y is selected from one of aluminum nitride and gallium nitride. Advantageously, a thickness of the third III-V group material layer 3y is between 5 nm and 6 nm.

Furthermore, two stress relaxation layers 6 respectively are disposed between the first superlattice layer 1 and the second superlattice layer 2, and between the second superlattice layer 2 and the third superlattice layer 3. Another stress relaxation layer is disposed on the third superlattice layer 3. The second superlattice stack 14 is disposed on the stress relaxation layer 6 which is on the third superlattice layer 3. Each of the stress relaxation layers 6 respectively includes a III-V group material layer. The III-V group material layer includes aluminum nitride, gallium nitride, indium nitride, aluminum gallium nitride, indium gallium nitride or aluminum indium nitride. In this embodiment, the stress relaxation layers 6 are preferably aluminum nitride. A thickness of each of the stress relaxation layers 6 needs to be greater than a relaxation critical thickness of each of the stress relaxation layers 6. The thickness of the relaxation critical thickness depends on materials of the stress relaxation layers 6. When the thickness of the stress relaxation layer 6 is greater than the relaxation critical thickness, relaxation generates in the stress relaxation layer 6. According to a preferred embodiment of the present invention, the relaxation critical thickness of each of the stress relaxation layers 6 is between 30 nm and 50 nm.

The second superlattice stack 14 includes at least a pair of undoped gallium nitride layer 14x and a carbon-doped gallium nitride layer 14y. In details, a layer of the carbon-doped gallium nitride layer 14y and a layer of the undoped gallium nitride layer 14x are defined as one pair, and the stacking sequence is not limited. That is, although the carbon-doped gallium nitride layer 14y is stacked on the undoped gallium nitride layer 14x in FIG. 1, based on different requirements, the undoped gallium nitride layer 14x can be stacked on the carbon-doped gallium nitride layer 14y. As shown in FIG. 2, a stack structure formed by the carbon-doped gallium nitride layer 14y and the undoped gallium nitride layer 14x can be repeated several times. That is, the second superlattice layer 14 can include numerous pairs of the undoped gallium nitride layer 14x and the carbon-doped gallium nitride layer 14y.

Figure 3:
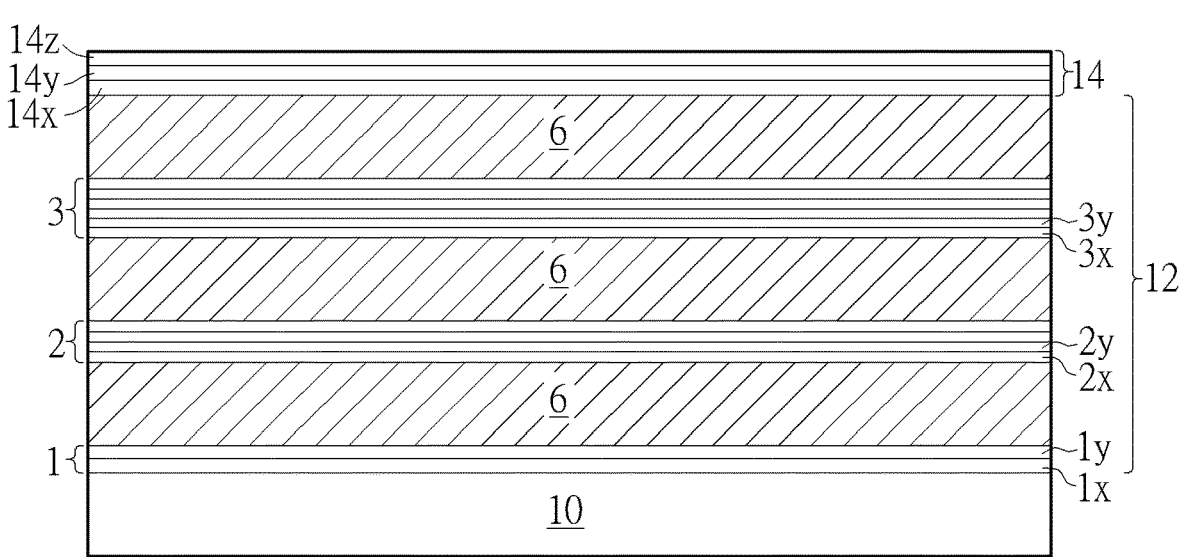
FIG. 3 depicts a varied type of a superlattice structure according to the first preferred embodiment.
Figure 4:
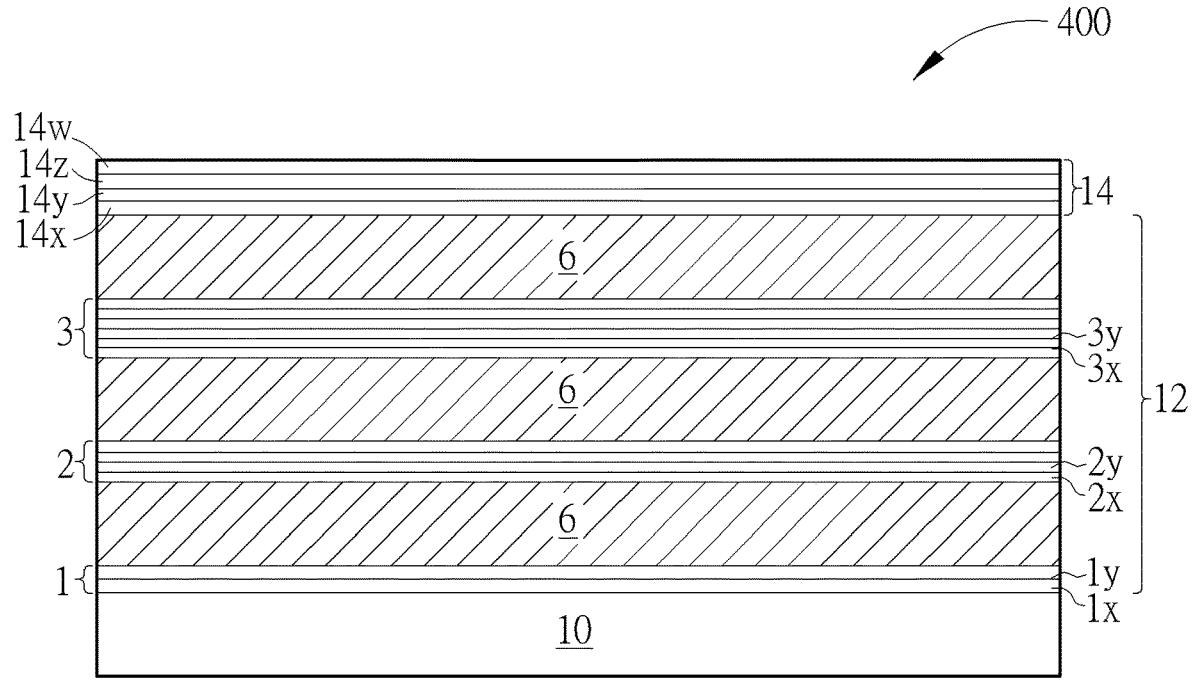
FIG. 4 depicts another varied type of a superlattice structure according to the first preferred embodiment.

FIG. 3 depicts a varied type of a superlattice structure according to the first preferred embodiment. FIG. 4 depicts another varied type of a superlattice structure according to the first preferred embodiment. Elements in FIG. 3 and FIG. 4 which substantially the same as those in the first preferred embodiment are denoted by the same reference numerals in FIG. 1; an accompanying explanation is therefore omitted.

As shown in FIG. 3, a second superlattice stack 14 of the superlattice structure 300 has a pair of undoped gallium nitride layer 14x and a carbon-doped gallium nitride layer 14y. An iron-doped gallium nitride layer 14z is disposed on the carbon-doped gallium nitride layer 14y. Other elements in FIG. 3 are the same as those in the first preferred embodiment, and an accompanying explanation is therefore omitted. Moreover, the stacking sequence of the undoped gallium nitride layer 14x, the carbon-doped gallium nitride layer 14y and the iron-doped gallium nitride layer 14z are not limited. In FIG. 3, the second superlattice stack 14 is exemplified by a stack structure includes a layer of undoped gallium nitride layer 14x, a layer of the carbon-doped gallium nitride layer 14y and a layer of the iron-doped gallium nitride layer 14z as an example, however, in other cases, the second superlattice stack 14 can be formed by repeating the stack structure several times, and the stacking sequence of the undoped gallium nitride layer 14x, the carbon-doped gallium nitride layer 14y and the iron-doped gallium nitride layer 14z in each of the stack structures can be varied.

As shown in FIG. 4, a second superlattice stack 14 of the superlattice structure 400 has a pair of undoped gallium nitride layer 14x and a carbon-doped gallium nitride layer 14y. An iron-doped gallium nitride layer 14z and a silicon-doped gallium nitride layer 14w are disposed on the carbon-doped gallium nitride layer 14y. Although the undoped gallium nitride layer 14x and a carbon-doped gallium nitride layer 14y, the iron-doped gallium nitride layer 14z and the silicon-doped gallium nitride layer 14w are stacked from bottom to top, however, in other embodiments, the stacking sequence of the undoped gallium nitride layer 14x and the carbon-doped gallium nitride layer 14y, the iron-doped gallium nitride layer 14z and the silicon-doped gallium nitride layer 14w can be altered. For instance, the stacking sequence can be changed to stack the carbon-doped gallium nitride layer 14y, the undoped gallium nitride layer 14x, the silicon-doped gallium nitride layer 14w and iron-doped gallium nitride layer 14z from bottom to top. Other elements in FIG. 4 are the same as those in the first preferred embodiment, and an accompanying explanation is therefore omitted.

Moreover, in FIG. 4, the second superlattice stack 14 is exemplified by a stack structure including a layer of undoped gallium nitride layer 14x, a layer of the carbon-doped gallium nitride layer 14y, a layer of the iron-doped gallium nitride layer 14z and a layer of silicon-doped gallium nitride layer 14w. However, in other cases, the second superlattice stack 14 can be formed by repeating the stack structure several times, and the stacking sequence of in each of the stack structures can be altered.

Figure 5:
FIG. 5 depicts a superlattice structure according to a second preferred embodiment of the present invention.
Figure 5:
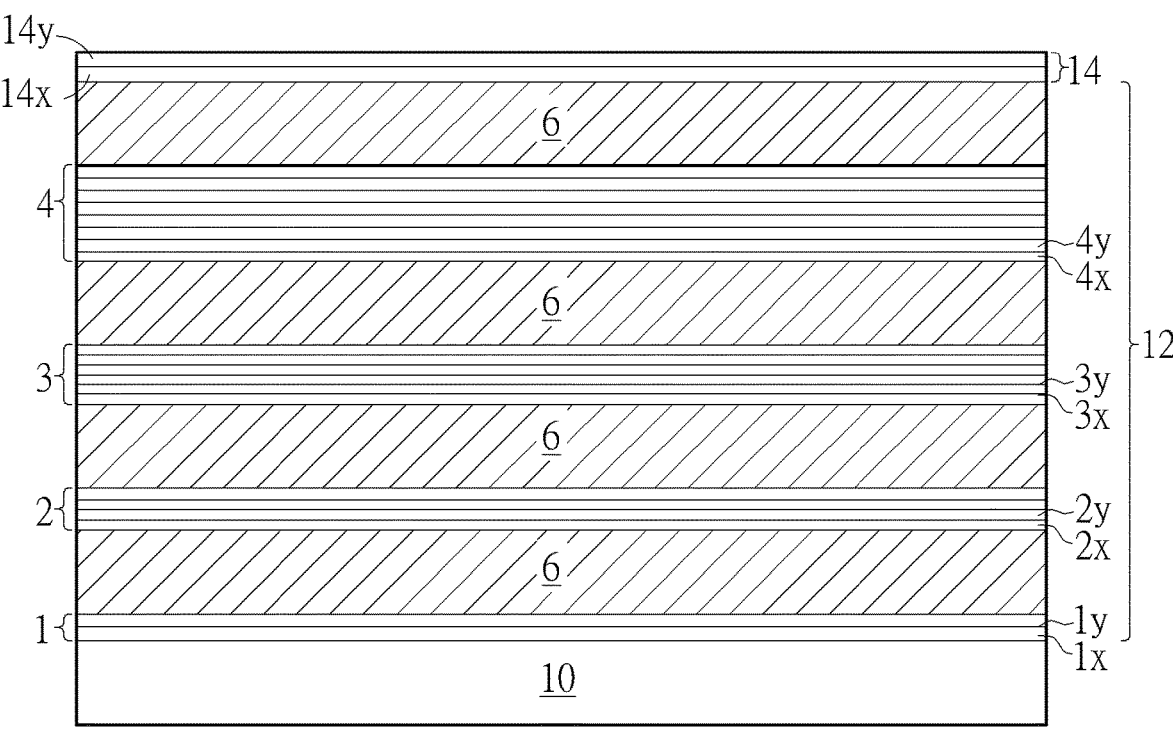

FIG. 5 depicts a superlattice structure according to a second preferred embodiment of the present invention, wherein elements which are substantially the same as those in the first preferred embodiment are denoted by the same reference numerals in FIG. 1; an accompanying explanation is therefore omitted. The difference between a superlattice structure 100 and a superlattice structure 500 are that in FIG. 5, the first superlattice stack 12 further includes a fourth superlattice layer 4 added on the top of the third superlattice layer 3. The fourth superlattice layer 4 includes D pair (s) of a fourth aluminum gallium nitride layer 4x and a fourth III-V group material layer 4y. According to a preferred embodiment of the present invention, D>C>B>A. D is a positive integer. However, in other cases, the number of A, B, C and D can be altered. A thickness of the fourth aluminum gallium nitride layer 4x is between 20 nm and 30 nm. The fourth III-V group material layer 4y is selected from one of aluminum nitride and gallium nitride. Moreover, another stress relaxation layer 6 is disposed between the fourth superlattice layer 4 and the third superlattice layer 3. Yet another stress relaxation layer 6 is disposed on the fourth superlattice layer 4. The thickness of each of the stress relaxation layers 6 needs to be greater than a relaxation critical thickness of each of the stress relaxation layers 6. The relaxation critical thickness of each of the stress relaxation layers 6 is between 30 nm and 50 nm. The second superlattice stack 14 is disposed on the stress relaxation layer 6 which is on the fourth superlattice layer 4. The second superlattice stack 14 includes a pair of undoped gallium nitride layer 14x and a carbon-doped gallium nitride layer 14y. However, based on different requirements, the second superlattice stack 14 in the second preferred embodiment can have a structure the same as the second superlattice stack 14 shown in FIG. 3 or FIG. 4.

Figure 6:
FIG. 6 depicts a superlattice structure according to a third preferred embodiment of the present invention.
Figure 6:
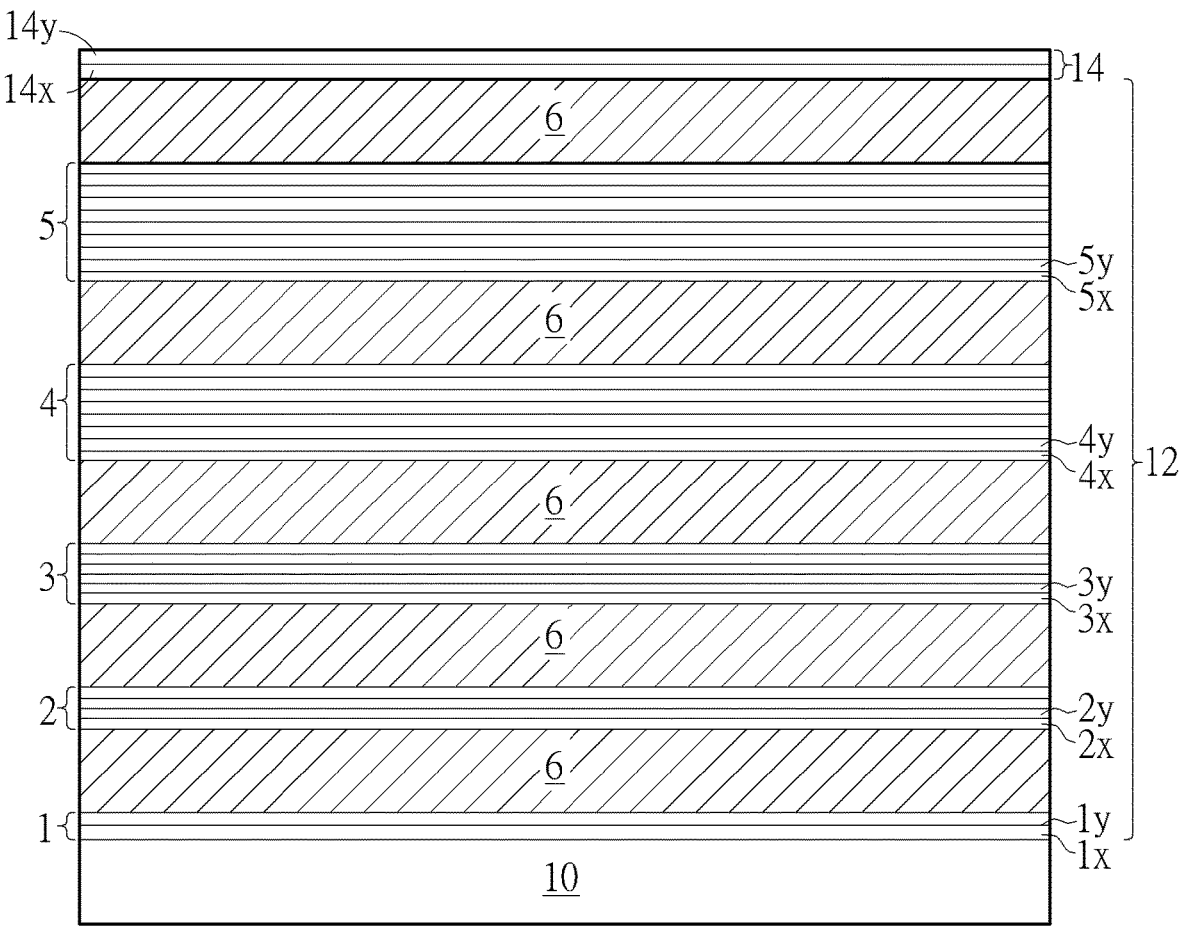

FIG. 6 depicts a superlattice structure according to a third preferred embodiment of the present invention, wherein elements which are substantially the same as those in the first preferred embodiment are denoted by the same reference numerals in FIG. 1; an accompanying explanation is therefore omitted. The difference between a superlattice structure 100 and a superlattice structure 600 are that in FIG. 5, the first superlattice stack 12 further includes a fourth superlattice layer 4 and a fifth superlattice layer 5 disposed on the top of the third superlattice layer 3. The fourth superlattice layer 4 includes D pair (s) of a fourth aluminum gallium nitride layer 4x and a fourth III-V group material layer 4y. The fifth superlattice layer 5 includes E pair (s) of a fifth aluminum gallium nitride layer 5x and a fifth III-V group material layer 5y. According to a preferred embodiment of the present invention, E>D>C>B>A. D and E are both positive integers. In other cases, the number of A, B, C and D can be altered. The fourth III-V group material layer 4y is selected from one of aluminum nitride and gallium nitride. The fifth III-V group material layer 5y is selected from one of aluminum nitride and gallium nitride.

Another two stress relaxation layers 6 are respectively disposed between the fourth superlattice layer 4 and the third superlattice layer 3 and between the fourth superlattice layer 4 and the fifth superlattice layer 5. A stress relaxation layer 6 is disposed on the fifth superlattice layer 5. The thickness of each of the stress relaxation layers 6 needs to be greater than a relaxation critical thickness of each of the stress relaxation layers 6. The relaxation critical thickness of each of the stress relaxation layers 6 is between 30 nm and 50 nm. The second superlattice stack 14 is disposed on the stress relaxation layer 6 which is on the fifth superlattice layer 5. The second superlattice stack 14 in FIG. 6 includes a pair of the undoped gallium nitride layer 14x and the carbon-doped gallium nitride layer 14y, which is the same as the second superlattice stack 14 in FIG. 1. Other elements are the same as those in FIG. 1; an accompanying explanation is therefore omitted.

Figure 7:
FIG. 7 depicts a varied type of a superlattice structure according to the third preferred embodiment.
Figure 7:
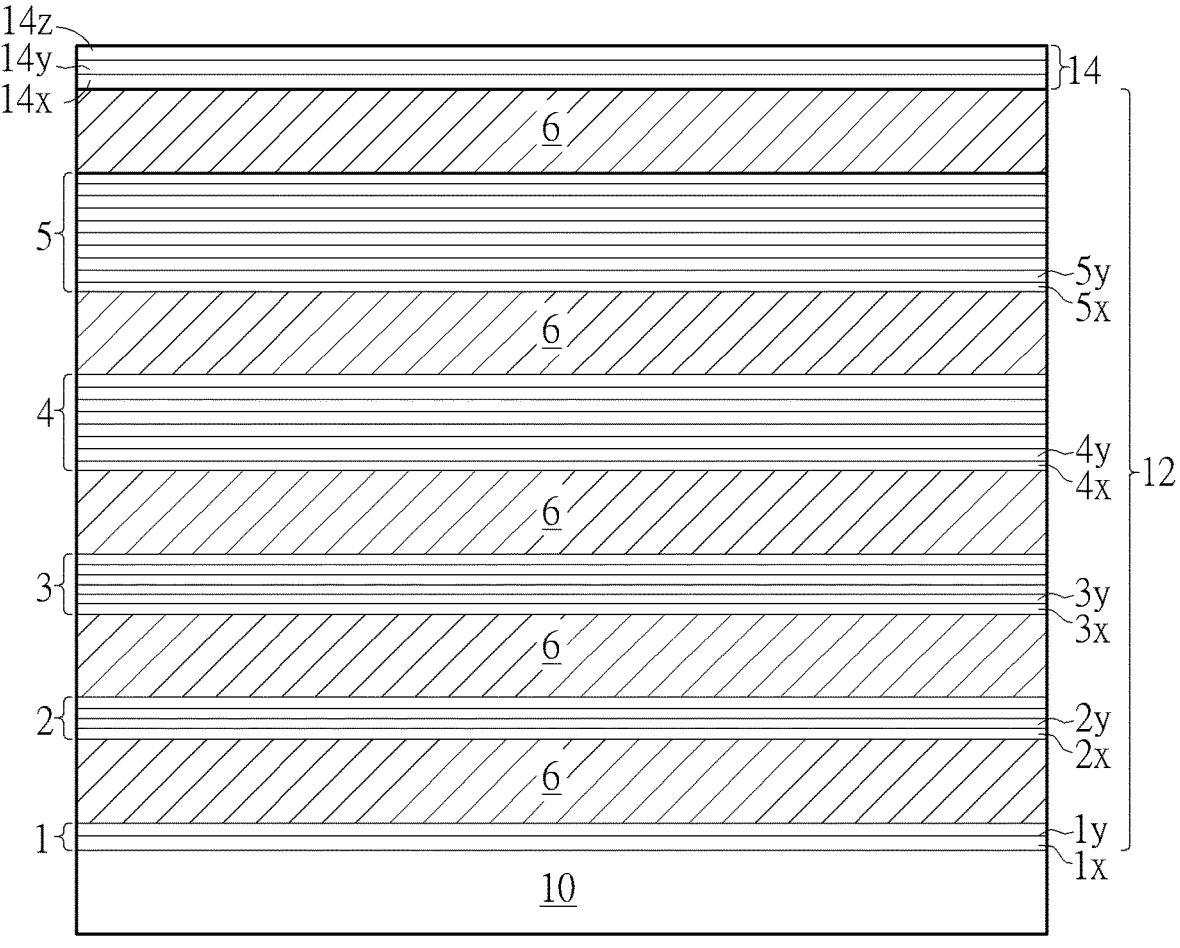
Figure 8:
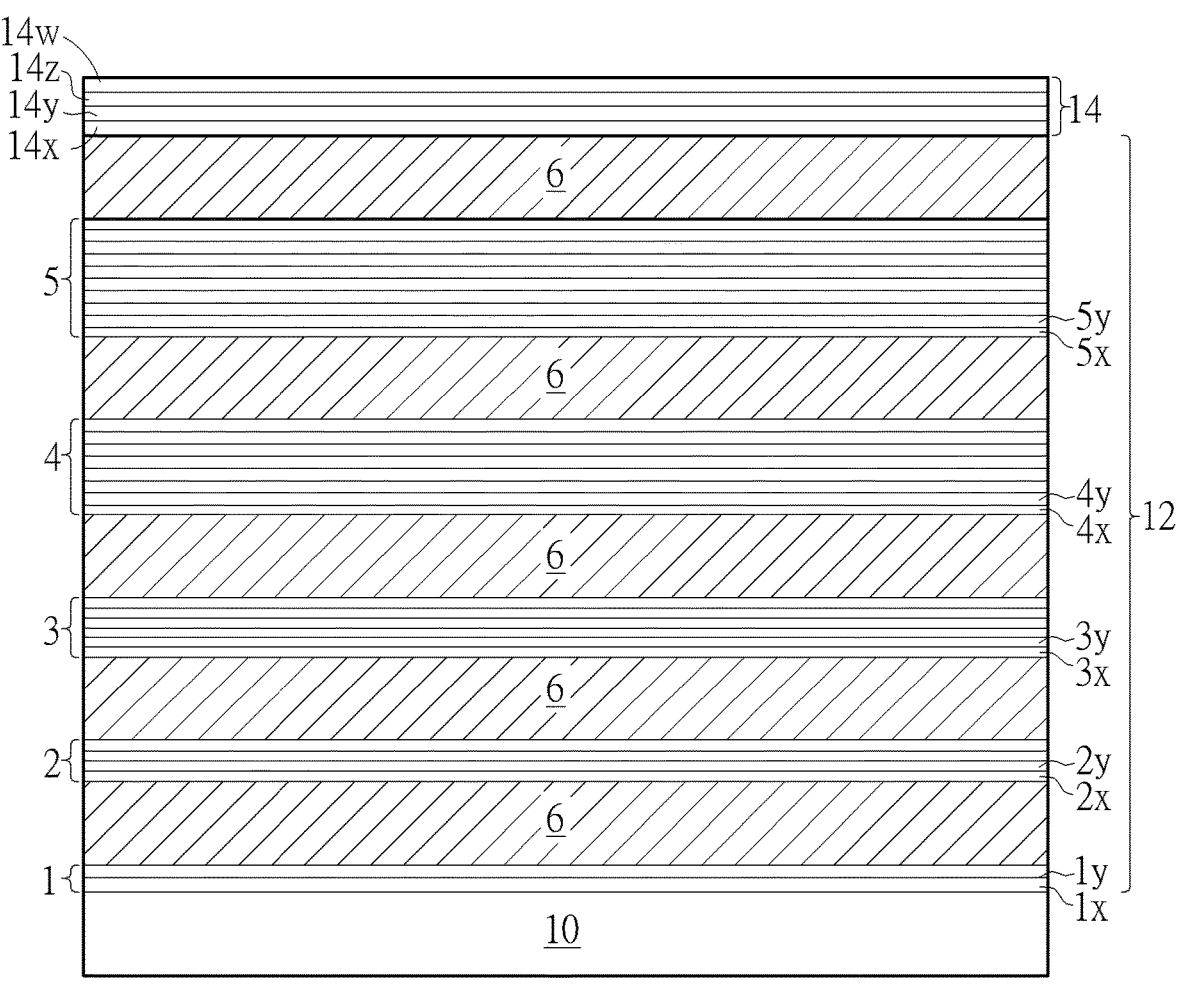
FIG. 8 depicts another varied type of a superlattice structure according to the third preferred embodiment.

FIG. 7 depicts a varied type of a superlattice structure according to the third preferred embodiment. FIG. 8 depicts another varied type of a superlattice structure according to the third preferred embodiment. Elements in FIG. 7 and FIG. 8 which are substantially the same as those in FIG. 1 are denoted by the same reference numerals; an accompanying explanation is therefore omitted.

The difference between a superlattice structure 700 and a superlattice structure 600 is that the second superlattice stack 14 in FIG. 7 has the same structure as the second superlattice stack 14 in FIG. 2. Other elements in the superlattice structure 700 are the same as those in the superlattice structure 600, and an accompanying explanation is therefore omitted. The difference between a superlattice structure 800 and a superlattice structure 600 is that the second superlattice stack 14 in FIG. 8 has the same structure as the second superlattice stack 14 in FIG. 4. Other elements in the superlattice structure 800 are the same as those in the superlattice structure 600, and an accompanying explanation is therefore omitted.

Figures 9, 10:
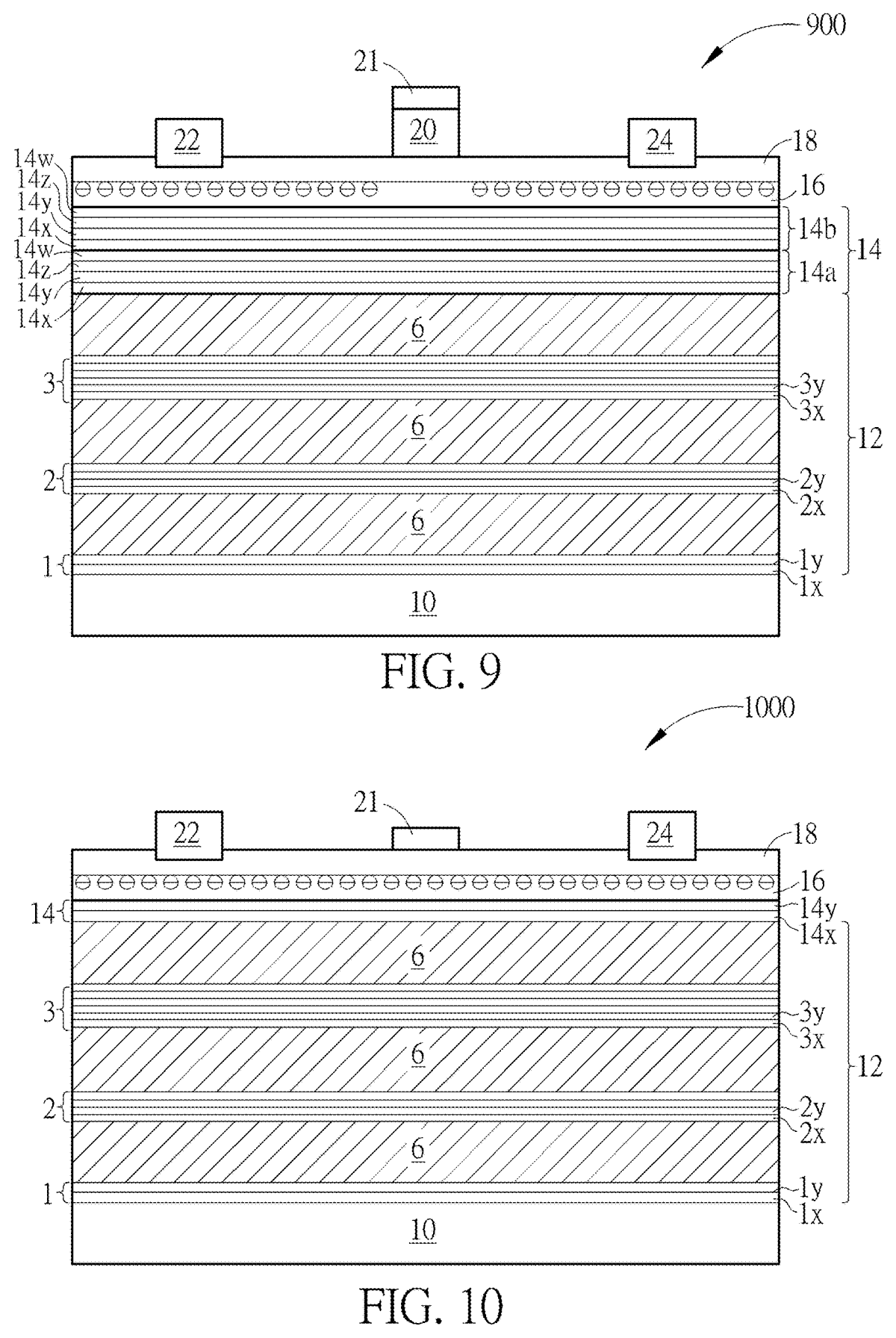

FIG. 9 depicts a normally-off transistor disposed on a superlattice structure of the present invention. FIG. 10 depicts a normally-on transistor disposed on a superlattice structure of the present invention. Elements in FIG. 9 and FIG. 10 which are substantially the same as those in the first preferred embodiment are denoted by the same reference numerals; an accompanying explanation is therefore omitted.

As shown in FIG. 9, a normally-off transistor 900 is disposed on a second superlattice stack 14. The superlattice structure 100 in FIG. 1 is applied to the normally-off transistor 900 in FIG. 9, but not limit to it. The normally-off transistor 900 can be disposed on the superlattice structure disclosed in FIG. 2 to FIG. 8. Please still refer to FIG. 9. The normally-off transistor 900 includes a channel layer 16 disposed on a varied type of the second superlattice stack 14 shown in FIG. 4. The second superlattice stack 14 in FIG. 9 includes a first stack structure 14a and a second stack structure 14b. The first stack structure 14a and the second stack structure 14b respectively include an undoped gallium nitride layer 14x, a carbon-doped gallium nitride layer 14y, an iron-doped gallium nitride layer 14z and a silicon-doped gallium nitride layer 14w disposed in a listed sequence from bottom to top. The iron-doped gallium nitride layer 14z is in direct contact with the carbon-doped gallium nitride layer 14y and the silicon-doped gallium nitride layer 14w. The carbon-doped gallium nitride layer 14y is in direct contact with the undoped gallium nitride layer 14x. The second stack structure 14b is stacked on and in direct contact with the first stack structure 14a. An active layer 18 is disposed on the channel layer 16. The channel layer 16 directly contacts the second superlattice stack 14. A P-type gallium nitride gate 20, a source electrode 22 and a drain electrode 24 are disposed on the active layer 18. A gate electrode 21 is disposed on the P-type gallium nitride gate 20. The channel layer 16 is preferably gallium nitride, and the active layer 18 is preferably aluminum gallium nitride. In other cases, the channel layer 16 can be other III-V group compounds such as aluminum gallium nitride, aluminum indium nitride, aluminum indium gallium nitride or aluminum nitride. The active layer 18 may include aluminum gallium nitride, aluminum indium nitride, aluminum indium gallium nitride or aluminum nitride. The source electrode 22 and the drain electrode 24 respectively include titanium, aluminum, nickel, platinum or gold.

As shown in FIG. 10, a normally-on transistor 1000 is disposed on a second superlattice stack 14. The superlattice structure 100 in FIG. 1 is applied to the normally-on transistor 1000 in FIG. 10, but not limit to it. The normally-on transistor 100 can be disposed on the superlattice structure disclosed in FIG. 2 to FIG. 8. The difference between the normally-on transistor 1000 and the normally-off transistor 900 is that the normally-on transistor 1000 does not include the P-type gallium nitride gate 20. Therefore, the gate electrode 21 is directly positioned on the active layer 18. In details, the normally-on transistor 1000 includes a channel layer 16 disposed on the second superlattice stack 14. An active layer 18 is disposed on the channel layer 16. A source electrode 22 and a drain electrode 24 are disposed on the active layer 18.

The fabricating method of the superlattice structure of the present invention will be illustrated as follows. As shown in FIG. 1, a substrate 10 is provided. A first superlattice stack 12 is formed on the substrate 10. The first superlattice stack 12 cab be formed by an epitaxial process such as a metal organic vapor phase epitaxy (MOVPE) process. Later, a first superlattice layer 1, a second superlattice layer 2 and a third first superlattice layer 3 are formed from bottom to top. Furthermore, stress relaxation layers 6 respectively disposed between the first superlattice layer 1 and the second superlattice layer 2, and between the second superlattice layer 2 and the third superlattice layer 3 can also be formed by an epitaxial process. The first superlattice layer 1 includes A pair(s) of a first aluminum gallium nitride layer 1$x$ and a first III-V group material layer 1$y$. The second superlattice layer 2 includes B pair(s) of a second aluminum gallium nitride 2$x$ layer and a second III-V group material layer 2$y$. The third superlattice layer 3 includes C pair (s) of a third aluminum gallium nitride layer 3$x$ and a third III-V group material layer 3$y$.

After forming the first superlattice stack 12, a second superlattice stack 14 is formed to be disposed on the first superlattice stack 12. The second superlattice stack 14 is manufactured by forming at least a pair of a undoped gallium nitride layer 14$x$ and a carbon-doped gallium nitride layer 14$y$. An iron-doped gallium nitride layer 14$z$ (shown in FIG. 3), a silicon-doped gallium nitride layer 14W or both the iron-doped gallium nitride layer 14$z$ and the silicon-doped gallium nitride layer 14$w$ (shown in FIG. 4) can be optionally formed on the undoped gallium nitride layer 14$x$ and the carbon-doped gallium nitride layer 14$y$ or between the undoped gallium nitride layer 14$x$ and the carbon-doped gallium nitride layer 14$y$.

Furthermore, as shown in FIG. 5, a fourth superlattice layer 4 can be optionally formed on the third superlattice layer 3 to constitute the first superlattice stack 12. The fourth superlattice layer 4 includes D pair(s) of a fourth aluminum gallium nitride layer 4$x$ and a fourth III-V group material layer 4$y$.

Alternatively, as shown in FIG. 6, a fifth superlattice layer 5 can be optionally formed on a fourth superlattice layer 4. The fourth superlattice layer 4 is formed on the third superlattice layer 3. The fourth superlattice layer 4 includes D pair (s) of a fourth aluminum gallium nitride layer 4$x$ and a fourth III-V group material layer 4$y$. The fifth superlattice layer 5 includes E pair (s) of a fifth aluminum gallium nitride layer 5$x$ and a fifth III-V group material layer 5$y$. Now, a superlattice structure of the present invention is completed.

The first superlattice layer, the second superlattice layer and the third superlattice layer in the first superlattice stack can block the stress generated by dislocations transmits vertically toward the active layer. However, when the pair number in the first superlattice layer, the second superlattice layer and the third superlattice layer exceed a certain number, the ability to block vertically-passing stress is decreased. Therefore, stress relaxation layers are respectively disposed between the first superlattice layer, the second superlattice layer and the third superlattice layer to release the stress generated in the first superlattice layer, the second superlattice layer and the third superlattice layer by interval. In this way, even may pairs are formed in the first superlattice layer, the second superlattice layer and the third superlattice layer respectively, the ability to block vertically-passing stress can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A superlattice structure, comprising:

a substrate;

a first superlattice stack disposed on the substrate, wherein the first superlattice stack comprises:

a first superlattice layer, a second superlattice layer and a third superlattice layer disposed from bottom to top, wherein the first superlattice layer comprises A pair(s) of a first aluminum gallium nitride layer and a first III-V group material layer, the second superlattice layer comprises B pair(s) of a second aluminum gallium nitride layer and a second III-V group material layer, the third superlattice layer comprises C pair(s) of a third aluminum gallium nitride layer and a third III-V group material layer, A, B, C are positive integers and C>B>A, and wherein a thickness of the first aluminum gallium nitride layer is different from a thickness of the first III-V group material layer; and two stress relaxation layers respectively disposed between the first superlattice layer and the second superlattice layer, and between the second superlattice layer and the third superlattice layer, wherein each of the two stress relaxation layers respectively comprises a III-V group material layer;

a second superlattice stack disposed on the first superlattice stack, wherein the second superlattice stack comprises a first stack structure and a second stack structure, wherein the second stack structure is stacked on and in direct contact with the first stack structure, the first stack structure and the second stack structure respectively comprise an undoped gallium nitride layer, a carbon-doped gallium nitride layer, an iron-doped gallium nitride layer and a silicon-doped gallium nitride layer disposed in a listed sequence from bottom to top, and wherein the iron-doped gallium nitride layer is in direct contact with the carbon-doped gallium nitride layer and the silicon-doped gallium nitride layer, and the carbon-doped gallium nitride layer is in direct contact with the undoped gallium nitride layer;

a channel layer disposed on and directly contacting the second superlattice stack;

an active layer disposed on the channel layer; and a source electrode and a drain electrode disposed on the active layer.

2. The superlattice structure of claim 1, wherein the first III-V group material layer is selected from one of aluminum nitride and gallium nitride, the second III-V group material layer is selected from one of aluminum nitride and gallium nitride, and the third III-V group material layer is selected from one of aluminum nitride and gallium nitride.

3. The superlattice structure of claim 1, wherein the first superlattice stack further comprises:

a fourth superlattice layer disposed on the third superlattice layer, wherein the fourth superlattice layer comprises D pair(s) of a fourth aluminum gallium nitride layer and a fourth III-V group material layer, D>C, D is a positive integer; and another stress relaxation layer disposed between the fourth superlattice layer and the third superlattice layer.

4. The superlattice structure of claim 1, wherein the first superlattice stack further comprises:

a fourth superlattice layer and a fifth superlattice layer disposed on the third superlattice layer from bottom to top, wherein the fourth superlattice layer comprises D pair(s) of a fourth aluminum gallium nitride layer and a fourth III-V group material layer, the fifth superlattice layer comprises E pair(s) of a fifth aluminum gallium nitride layer and a fifth III-V group material layer, E>D>C, E and D are both positive integers; and another two of the stress relaxation layers respectively disposed between the fourth superlattice layer and the third superlattice layer and between the fourth superlattice layer and the fifth superlattice layer.

5. The superlattice structure of claim 1, wherein the first superlattice stack further comprises:

a fourth superlattice layer disposed on the third superlattice layer, wherein the fourth superlattice layer comprises at least a pair of a fourth aluminum gallium nitride layer and a fourth III-V group material layer; and another stress relaxation layer disposed between the fourth superlattice layer and the third superlattice layer.

6. The superlattice structure of claim 1, wherein the first superlattice stack further comprises:

a fourth superlattice layer and a fifth superlattice layer disposed on the third superlattice layer from bottom to top, wherein the fourth superlattice layer comprises at least a pair of a fourth aluminum gallium nitride layer and a fourth III-V group material layer, the fifth superlattice layer comprises at least a pair of a fifth aluminum gallium nitride layer and a fifth III-V group material layer; and another two of the stress relaxation layers respectively disposed between the fourth superlattice layer and the third superlattice layer and between the fourth superlattice layer and the fifth superlattice layer.

7. The superlattice structure of claim 1, wherein the III-V group material layer comprises aluminum nitride, gallium nitride, indium nitride, aluminum gallium nitride, indium gallium nitride or aluminum indium nitride.

8. The superlattice structure of claim 1, wherein a thickness of each of the two stress relaxation layers is greater than a relaxation critical thickness of each of the two stress relaxation layers.

9. The superlattice structure of claim 1, wherein a thickness of each of the two stress relaxation layers is between 30 nm and 50 nm.

10. The superlattice structure of claim 1, further comprising:

a normally-off transistor disposed on the second superlattice stack, wherein the normally-off transistor comprises:

a P-type gallium nitride gate disposed on the active layer.

11. The superlattice structure of claim 1, further comprising:

a normally-on transistor disposed on the second superlattice stack, wherein the normally-on transistor comprises:

a gate electrode disposed on the active layer.

12. The superlattice structure of claim 1, wherein the thickness of the first aluminum gallium nitride layer is between 20 nm and 30 nm, a thickness of the second aluminum gallium nitride layer is between 20 nm and 30 nm, and a thickness of the third aluminum gallium nitride layer is between 20 nm and 30 nm.

13. The superlattice structure of claim 1, wherein the thickness of the first III-V group material layer is between 5 nm and 6 nm, a thickness of the second III-V group material layer is between 5 nm and 6 nm, and a thickness of third III-V group material layer is between 5 nm and 6 nm.

14. The superlattice structure of claim 1, further comprising another stress relaxation layer disposed on the third superlattice layer.

* * * * *